(12) United States Patent
Massoudi

(10) Patent No.: US 11,983,032 B2
(45) Date of Patent: May 14, 2024

(54) PATH MARGIN MONITOR INTEGRATION WITH INTEGRATED CIRCUIT

(71) Applicant: Synopsys, Inc., Mountain View, CA (US)

(72) Inventor: Firooz Massoudi, Palo Alto, CA (US)

(73) Assignee: Synopsys, Inc., Sunnyvale, CA (US)

( * ) Notice: Subject to any disclaimer, the term of this patent is extended or adjusted under 35 U.S.C. 154(b) by 227 days.

(21) Appl. No.: 17/719,222

(22) Filed: Apr. 12, 2022

(65) Prior Publication Data
US 2023/0324949 A1 Oct. 12, 2023

(51) Int. Cl.
*G06F 11/00* (2006.01)
*G06F 1/10* (2006.01)

(52) U.S. Cl.
CPC ........................... *G06F 1/10* (2013.01)

(58) Field of Classification Search
CPC ........ G06F 1/04; G06F 1/10; G01R 31/31725
See application file for complete search history.

(56) References Cited

U.S. PATENT DOCUMENTS

| | | | |
|---|---|---|---|
| 7,941,772 B2 * | 5/2011 | Bueti ................ | G06F 11/1608 716/108 |
| 8,887,120 B1 * | 11/2014 | Verma ...................... | H03K 5/06 326/29 |
| 9,134,374 B2 * | 9/2015 | Sunter ............ | G01R 31/318577 |
| 9,490,817 B1 * | 11/2016 | Rosen ...................... | H03L 7/07 |
| 10,054,635 B2 * | 8/2018 | Lillestolen ................ | G06F 1/08 |
| 10,451,670 B2 * | 10/2019 | Clerc .................. | G01R 31/2882 |
| 11,385,282 B2 | 7/2022 | Landman et al. | |
| 11,409,323 B2 * | 8/2022 | Herberholz ............. | G06F 21/71 |
| 2005/0218956 A1 * | 10/2005 | LaBerge .................... | G06F 1/12 327/291 |
| 2008/0071489 A1 | 3/2008 | Wissel | |
| 2011/0267096 A1 * | 11/2011 | Chlipala .......... | G01R 31/31858 326/16 |
| 2013/0088256 A1 | 4/2013 | Chlipala et al. | |
| 2014/0132315 A1 | 5/2014 | Sharma et al. | |
| 2022/0006459 A1 | 1/2022 | Bautista et al. | |

OTHER PUBLICATIONS

PCT International Search Report and Written Opinion, PCT Application No. PCT/US2023/014627, dated Jun. 15, 2023, 12 pages.

* cited by examiner

*Primary Examiner* — Esaw T Abraham
(74) *Attorney, Agent, or Firm* — Fenwick & West LLP

(57) ABSTRACT

The timing margin of various signal paths in an integrated circuit is monitored by components on the integrated circuit itself. Path margin monitor (PMM) circuits on the integrated circuit receive (a) functional signals propagating along signal paths in the integrated circuit, and (b) corresponding clock signals that are used to clock the functional signals. The PMM circuits output signals (PMM signals) which are indicative of the actual timing margins for the signal paths. For convenience, these will be referred to as path margins. A controller is also integrated on the integrated circuit. The controller controls the PMM circuits. It also receives and analyzes the PMM signals to monitor the path margins across the integrated circuit. Automated software is used to automatically insert instances of the PMM circuits into the design of the integrated circuit. The controller may also be automatically configured and inserted into the design.

20 Claims, 10 Drawing Sheets

PATH MARGIN MONITOR INTEGRATION WITH INTEGRATED CIRCUIT

TECHNICAL FIELD

The present disclosure generally relates to a functional path monitoring system for an electronic circuit. In particular, the present disclosure relates to in-situ monitoring of timing margins of signal paths in integrated circuits.

BACKGROUND

As technology nodes shrink and the complexity and gate count of devices increase, the traditional methods of characterization at manufacturing are not sufficient to optimize performance in the field. With the advent of critical mission mode applications like automotive electronics or health monitoring devices, failure avoidance and prediction are increasingly important requirements for the control electronics of such critical mission mode applications. Currently, ring oscillators and other process, voltage and temperature monitors may be used to measure various parameters in an operating device in the field. However, their accuracy, scope and usage are limited.

SUMMARY

In one aspect, the timing margin of various signal paths in an integrated circuit is monitored by components on the integrated circuit itself. Path margin monitor (PMM) circuits on the integrated circuit receive (a) functional signals propagating along signal paths in the integrated circuit, and (b) corresponding clock signals that are used to clock the functional signals. The PMM circuits output signals (PMM signals) which are indicative of the actual timing margins for the signal paths. For convenience, these will be referred to as path margins. A controller is also integrated on the integrated circuit. The controller controls the PMM circuits. It also receives and analyzes the PMM signals to monitor the path margins across the integrated circuit.

In another aspect, automated software is used to automatically insert instances of the PMM circuits into the design of the integrated circuit. The controller may also be automatically configured and inserted into the design.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
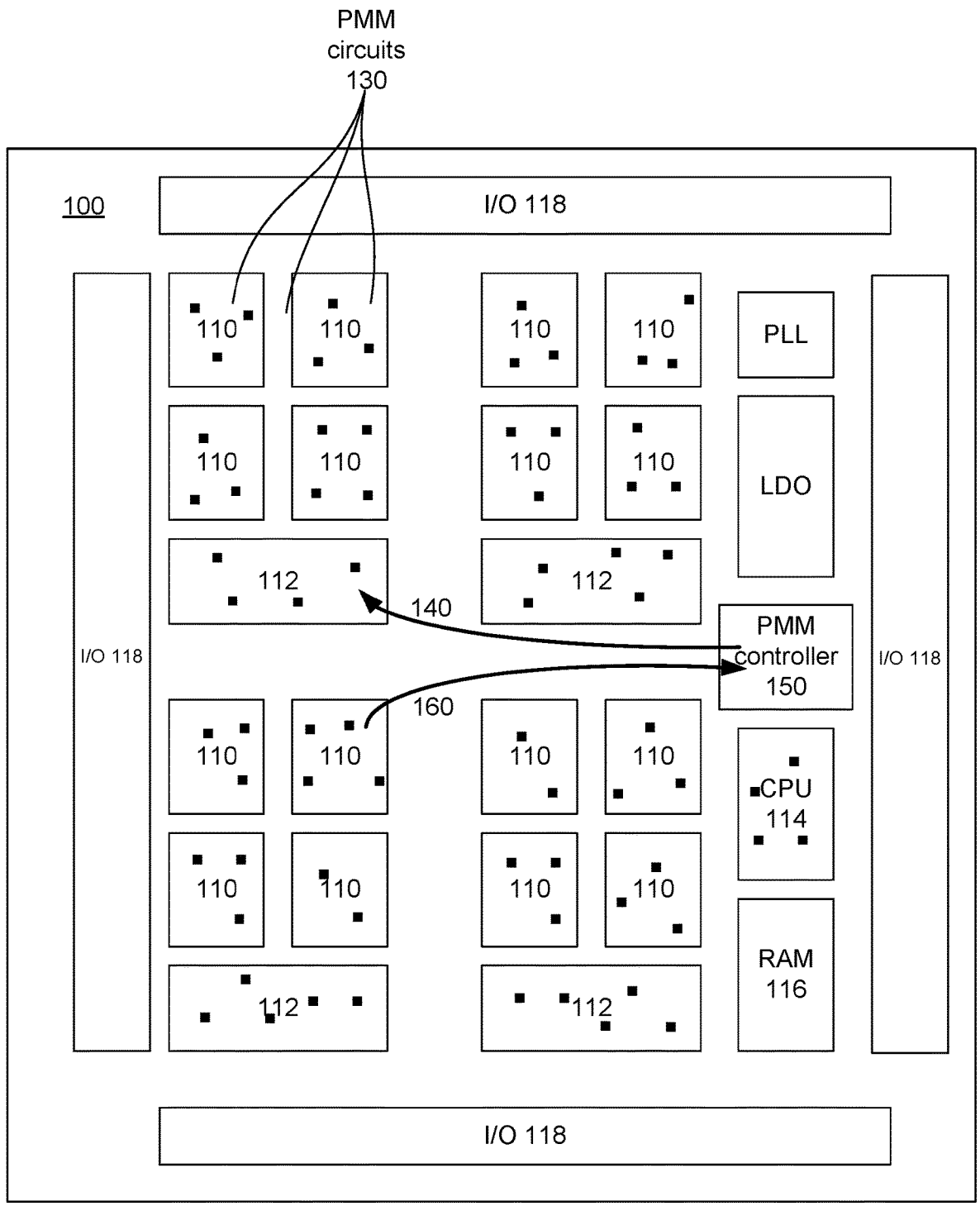
FIG. 1 is a block diagram of an integrated circuit with a built-in path margin monitoring (PMM) system, in accordance with some embodiments of the present disclosure.

Aspects of the present disclosure relate to path margin monitors integrated as part of an integrated circuit. In digital circuits, signals propagate between sequential circuits, such as flip flops and registers, according to timing determined by clocks. For clarity, the propagating signals will be referred to as functional signals to distinguish them from the clock signals. In order for digital circuits to function properly, the functional signals must arrive at the next sequential circuit at least a certain amount of time before the relevant clock signal. The difference between when the functional signal arrives and the latest time when it could arrive is referred to as the timing margin or path margin or simply margin.

During the design of the integrated circuit, the timing of the circuit is simulated to ensure that there is sufficient margin (e.g., a margin satisfying a threshold margin) along the different signal paths in the integrated circuit. However, the actual margins in a fabricated chip may differ from the simulations, and the margins may change as a function of temperature and voltage. Moreover, the margins may also change over time as the chip ages. As a result, it would be beneficial to have the ability to characterize and monitor actual margins across different locations in an operating chip.

In one aspect, this is achieved by implementing a path margin monitoring system as part of the integrated circuit. The system includes path margin monitor (PMM) circuits distributed throughout the integrated circuit. The instances of the PMM circuits measure path margins along different signal paths in the integrated circuit. In one approach, the PMM circuits receive the functional signals propagating along the signal paths being monitored and also receive the corresponding clock signals used to clock the functional signals. The functional signal is compared to delayed versions of the functional signal to determine what amount of delay will result in a mismatch between the two. That amount of delay is a measure of the path margin for that signal path.

The system also includes a controller as part of the integrated circuit. The controller controls the instances of the PMM circuits, and also receives and analyzes the data produced by the PMM circuits. For example, the controller may analyze the signals from the PMM circuits (PMM signals) to determine the amount of the lowest path margin from among the set of signal paths monitored by a PMM circuit. The controller may then set the PMM circuits to monitor this slowest signal path to detect degradation in the path margin.

The capabilities of the PMM system may be used during manufacturing, test and/or calibration. They may also be used to monitor the integrated circuit during normal operation of the chip. The PMM circuits preferably are small, so that many of them may be distributed throughout the integrated circuit. For example, each PMM circuit may contain approximately 150 gates. As a result, path margins across an integrated circuit may be monitored more accurately and more thoroughly. This enables real-time monitoring of the integrated circuit performance, and earlier identification and detection of possible problems. The path margin data may also be combined with process, voltage, temperature (PVT) and other sensor data to provide a more accurate insight into the device reliability and to enable power/performance optimization during normal operation.

The ability to monitor path margins in real-time in the field during mission mode can have many advantages. For example, cross talk and aging effects of functional paths may be captured and monitored over time. Direct measurement of path margins makes it possible to correlate measured margins with simulations and pre-silicon timing estimates. Measured path margins may be used to improve libraries and timing models. Path margin data can also be used to improve yield analysis. PMMs can also be used to measure toggle rates (the rate at which a signal switches), which is important in monitoring aging and mean time between failure (MTBF) analyses. PMMs may also enable better in-field performance optimization and enhanced voltage/frequency scaling.

As an example, FIG. 1 is a block diagram of an integrated circuit with a built-in path margin monitoring system, in accordance with some embodiments of the present disclosure. In this particular example, the integrated circuit 100 is partitioned into four sectors, each with four processor cores 110 and associated logic 112. The integrated circuit also includes a master central processing unit (CPU) 114, on-chip memory 116, and input/output (I/O) functions 118 such as serializer/deserializer (Serdes), Peripheral Component Interconnect Express (PCIe), High-Definition Multimedia Interface (HDMI), and double data rate (DDR).

The PMM system includes instances of PMM circuits, shown as black squares some of which are labelled 130, and a PMM controller 150. Instances of the PMM circuits 130 are distributed throughout the integrated circuit in order to monitor path margin at different points across the integrated circuit. In FIG. 1, for convenience, PMM circuits 130 are not shown in every block. In alternate embodiments, PMM circuits 130 may be inserted in other blocks as well. As some examples, PMM circuits can be used for memory I/O delay measurements and can also be used for chip I/O delay measurements.

The PMM circuits 130 are integrated alongside the functional signal paths being monitored. As a result, the integrated circuit may be monitored in real-time during normal operation. Normal operation is sometimes referred to as mission mode. That is, the PMM circuits do not require a special monitor mode, and mission mode need not be interrupted in order to take path margin measurements.

The PMM controller 150 is also integrated on-chip. In FIG. 1, it is shown as one block but it may be implemented in a distributed fashion. The PMM controller 150 communicates with the PMM circuits 130. The controller 150 sends control signals 140 to the PMM circuits 130. For example, the PMM system may have different modes of operation. Detection mode, monitor mode, and toggle count mode are three modes described briefly here and in more detail below. In detection mode, the PMM system performs a sequence of measurement steps to determine the slowest signal path (i.e., the signal path with the lowest path margin) from among the signal paths monitored by a PMM circuit, and the amount of the path delay for the slowest signal path. In monitor mode, the PMM system continuously monitors the slowest paths to detect and/or predict changes in the margin for these paths. In toggle count mode, the PMM system detects transitions in the selected signal paths over a predefined time duration. The PMM controller 150 sends control signals 140 to the PMM circuits to configure them for the current mode of operation. Periodically, the controller may set the PMM circuits to detection mode to determine the slowest signal path, and then switch back to monitor mode to monitor those signal paths. The controller may use toggle mode for a different use case where signal transitions are important. Any of these modes may be run while the chip is in mission mode, thus providing real-time information about the chip operation.

The PMM controller 150 also receives data from the PMM circuits. This includes the PMM signals 160, which are the output produced by the PMM circuits from their measurement of path margins. The controller 150 analyzes the PMM signals 160, thus providing a path margin monitoring capability across the integrated circuit. For example, it may combine the data from the individual PMM circuits to provide a chip-level model of the path margin.

Because both the PMM circuits 130 and the PMM controller 150 are on-chip, the PMM system may provide real-time in-situ monitoring of path margins across the integrated circuit. The data produced by the PMM system may be consumed on-chip. For example, path margin is affected by operating voltage, temperature and clock speed. The path margin measurements may be used as feedback to other circuitry on the chip, which may alter their operation accordingly. For example, if path margin starts to degrade in a section of the chip, the clock speed may be decreased, or thermal heat accumulation may be decreased by increasing cooling or reducing power consumption. On the other hand, if there is excess path margin in a section of the chip, the clock speed may be increased, or thermal heat accumulation may be allowed to increase by decreasing cooling or increasing power consumption. The collected PMM data may be used to explore operational limits such as clock speed and voltage.

The PMM data produced by the PMM system may also be used to monitor changes in path margin over the lifetime of the chip. Current PMM data may be compared to historical data to identify trends and predict future problems. The PMM data may also be analyzed off-chip. For example, more complex analysis may require computational resources that are not available on-chip, and storage of PMM data captured over long periods of time may require more space than is available on-chip. Analysis may also combine the PMM data with other data that is not available on-chip, for example external measurements of temperature or power consumption. As another example, PMM data from multiple chips may be analyzed together to provide a view of a board, a rack-mounted device or other environment that is larger than just a single chip.

Figure 2A:
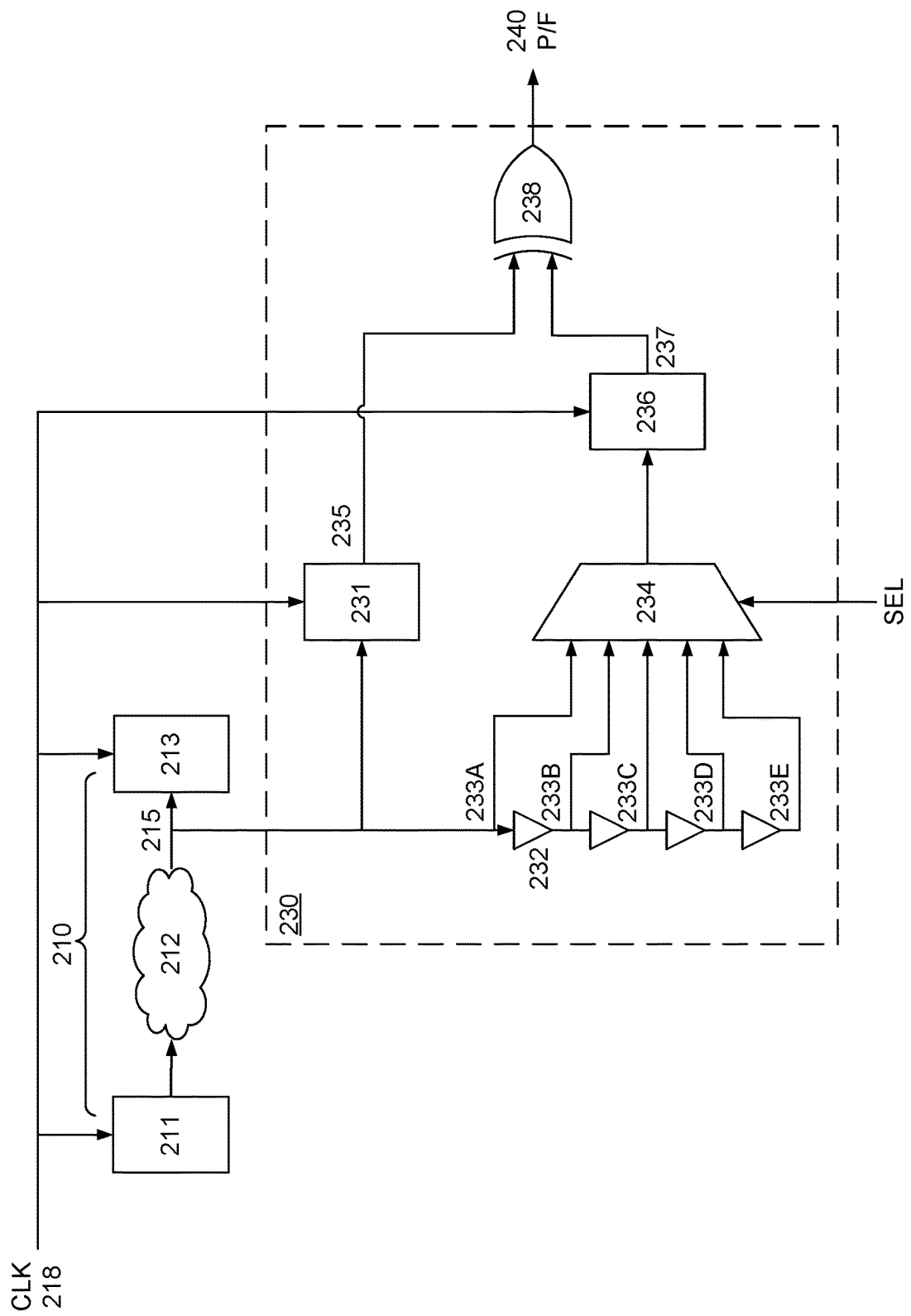
FIG. 2A is a block diagram of a PMM circuit, in accordance with some embodiments of the present disclosure.
Figure 2B:
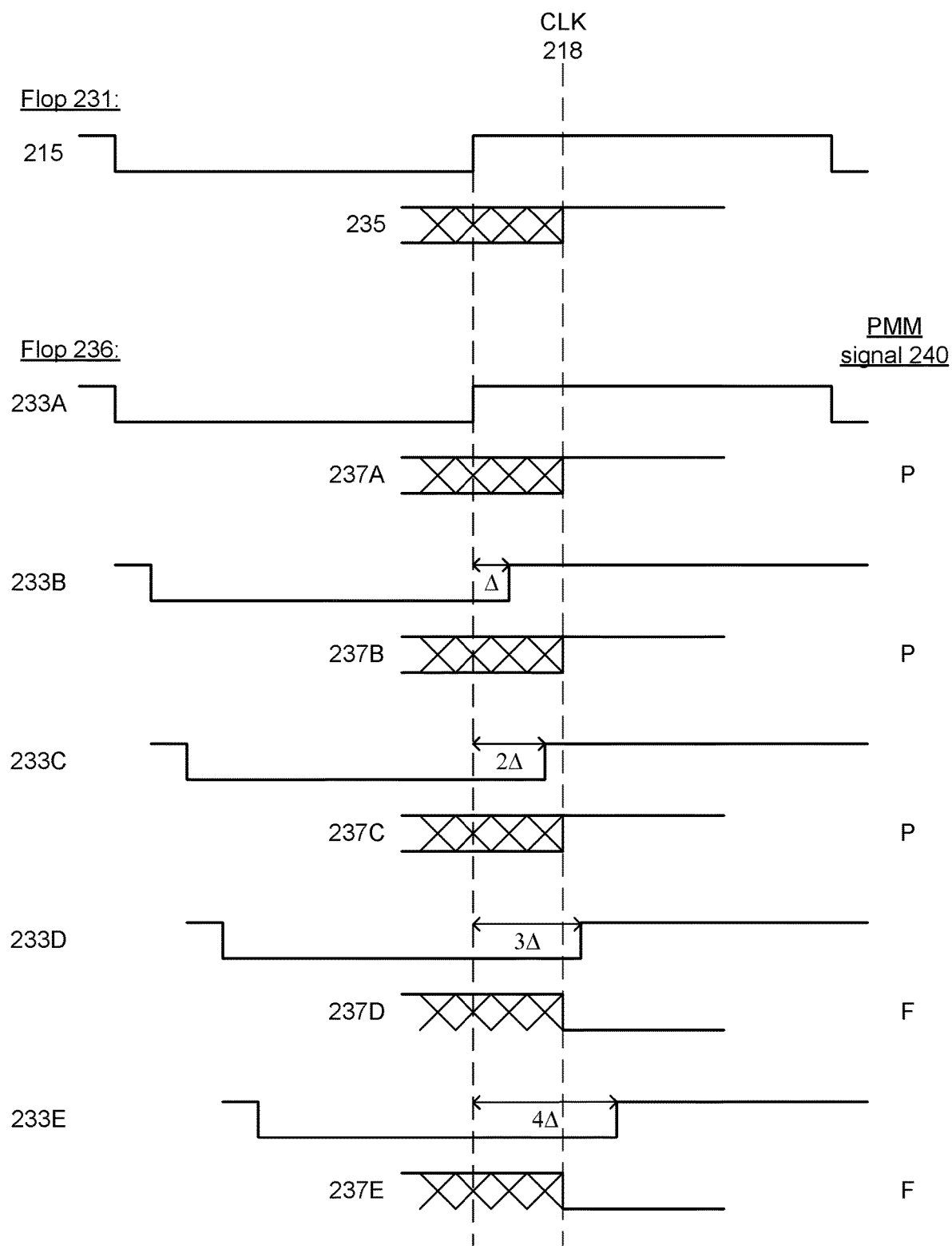
FIG. 2B is a timing diagram showing operation of the PMM circuit of FIG. 2A.

FIG. 2A is a block diagram of a PMM circuit, in accordance with some embodiments of the present disclosure. FIG. 2B is a timing diagram showing operation of the PMM circuit of FIG. 2A. FIG. 2A shows a signal path 210 which originates at sequential circuit 211, propagates through combinational circuitry 212 and terminates at sequential circuit 213. In this example, the sequential circuits 211, 213 are flip flops (also referred to as flops herein), and the originating flop 211 and terminal flop 213 are both clocked by clock signal 218. This example shows one originating flop 211 for clarity, but there may be multiple originating flops to produce the functional signal received by the terminal flop 213. The signals propagating along the signal path 210 will be referred to as functional signals 215, to avoid confusion with the clock signal 218.

The PMM circuit 230 monitors the path margin of this signal path 210. The PMM circuit 230 receives both the functional signal 215 and the clock signal 218, and outputs a PMM signal 240 that is indicative of the path margin for the signal path 210. The PMM circuit 230 includes two flip flops 231, 236, both of which are the same as flip flop 213 and also clocked by clock signal 218. Flop 231 receives the functional signal 215. Flop 236 receives a delayed version of the functional signal 215. Here, the functional signal 215 is input to a chain of delay buffers 232, each of which adds some delay Δ. At each point along the chain, the functional signal is delayed by a different amount. These delayed versions 233A-E are inputs to a multiplexer 234, which selects which delayed version to send to flop 236. The SEL signal to the multiplexer is determined by the PMM controller, either directly or indirectly. For example, the controller may set the operating mode of the PMM circuit, which then determines the sequence of SEL signals applied over time. Alternatively, the controller may send SEL signals directly to the multiplexer. A comparator 238 (e.g., XOR or XNOR) compares the undelayed version 235 from flop 231 and the selected delayed version 237 from flop 236. The output is indicated as either a pass (P) if the two inputs 235 and 237 are the same, or a fail (F) if the two inputs 235 and 237 are different at a particular time.

FIG. 2B is a timing diagram illustrating this operation. In this example, the functional signal 215 is toggling between 0 and 1. Five delayed versions 233A-E are shown, with delays ranging from 0 for 233A to 4Δ for 233E, where Δ is the delay introduced by a single buffer. The delay per buffer depends on the technology node. For example, at more advanced nodes, the delay per buffer may be about 15 ps. The number of buffers may also vary. For example, 8 or 16 buffers may be used. The timing of the flops 231, 236 is determined by the clock signal 218. FIG. 2B shows a dashed line at the time point where the clock signal 218 causes the flops 231, 236 to capture their input values. Flop 231 receives the functional signal 215 and captures a logic 1. It outputs signal 235. For clarity, output signal 235 is shown only after the CLK trigger 218. Version 233A has zero delay and flop 236 would also capture a logic 1 if this version is selected by the multiplexer 234 with the corresponding output 237A. Versions 233B,C have increasing delay but the logic 1 value still arrives in sufficient time to be captured by flop 236, resulting in output signals 237B,C. In versions 233D,E, the delay exceeds the available path margin so the flop 236 would capture the next bit instead, which is the output signal 237D,E of logic 0. The corresponding output 240 of the comparator is shown in the right column. P stands for pass, meaning that the signal path has sufficient path margin to continue to operate correctly even with the additional time delay. F stands for fail, meaning that the path margin is not sufficient to accommodate the additional delay. Versions 233A-C pass and versions 233D-E fail. From this, it can be deduced that the actual path margin is between 24 and 3Δ.

In the example circuit shown in FIG. 2A, not all of the delayed versions 233A-E are compared on every clock cycle. Rather, on each clock cycle, only one delayed version is selected by multiplexer 234. Other delayed versions are compared on other clock cycles. In an alternative version, multiple values could be compared on a single clock cycle if additional flops were added to capture the different versions. However, this adds area to the PMM circuit, which would be multiplied by the number of PMM circuits on the chip.

In addition, a comparator output indicating a pass P may be generated in two different ways. If the functional signal 215 changes value and the delay introduced is less than the current path margin, then the comparator will output a pass P, as shown for versions 233A-C in FIG. 2B. However, if the functional signal does not change value, for example if there are a series of logic 1's in a row, then the comparator will also output a pass P even if the delay exceeds the current path margin. One challenge is that the data flowing through the signal paths during mission mode is not controlled, so the PMM system may not be able to determine that the functional signal is changing value. One way to address this effect is to add circuitry to determine whether the functional signal is changing value, at the expense of added area. Another way to mitigate this effect is to take multiple samples, which increases the chances of sampling a functional signal that is changing value. As a result, an initial determination of the path margin may require multiple clock cycles.

Figure 2C:
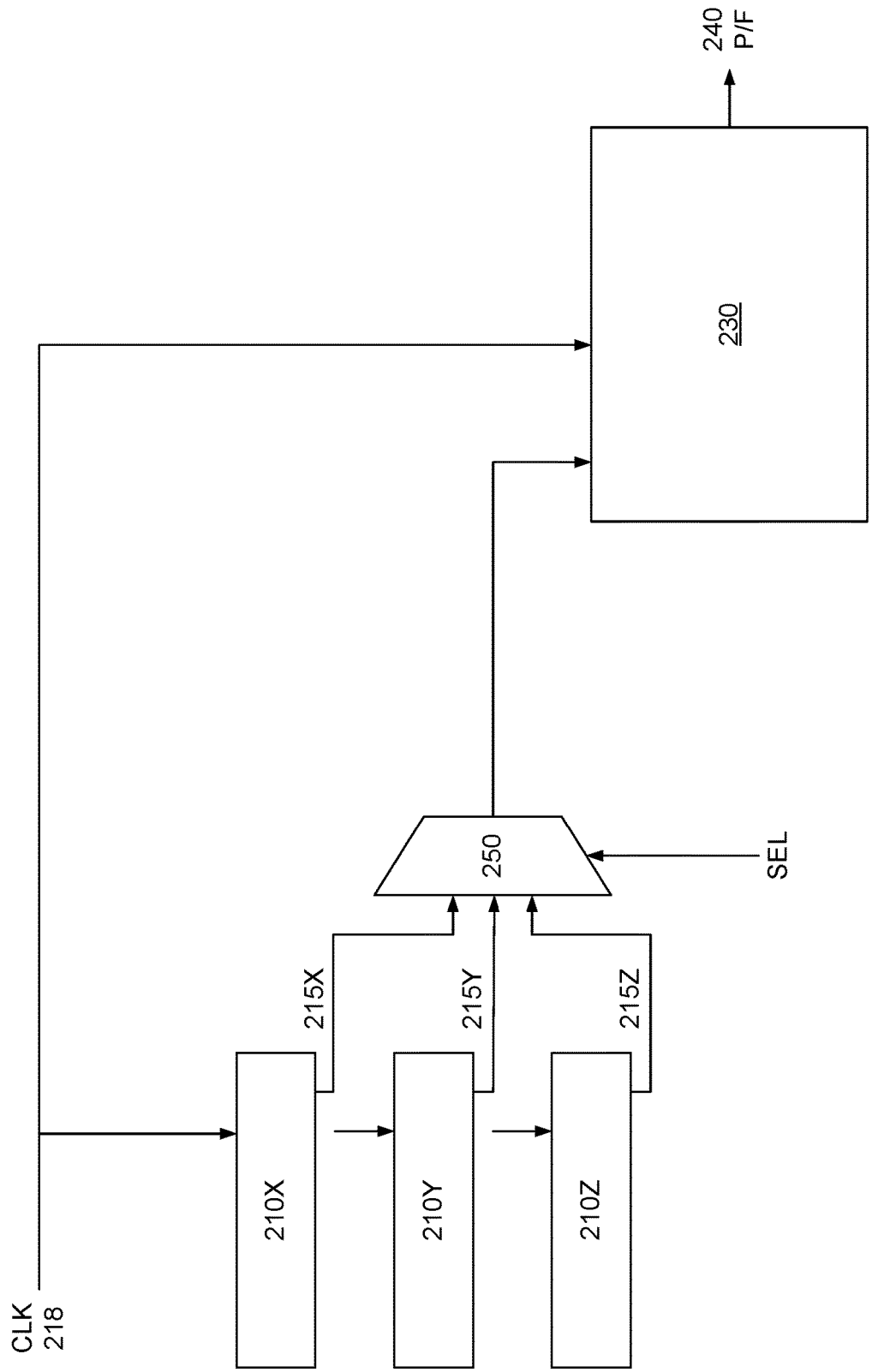
FIG. 2C is a block diagram of multiple signal paths multiplexed to a PMM circuit, in accordance with some embodiments of the present disclosure.

FIG. 2A shows a single functional signal 215, produced by a signal path 210 to a single flop 213. If multiple signal paths and functional signals are monitored, the same PMM circuit 230 could be shared by adding a multiplexer 250 at the input to circuit 230, as shown in FIG. 2C. In FIG. 2C, there are multiple signal paths 210X,Y,Z, each of which is clocked by CLK 218 and produces corresponding functional signal 215X,Y,Z. These are used as the different inputs to the multiplexer 250, with the multiplexer selecting which signal to connect to the PMM circuit 230.

Figure 3:
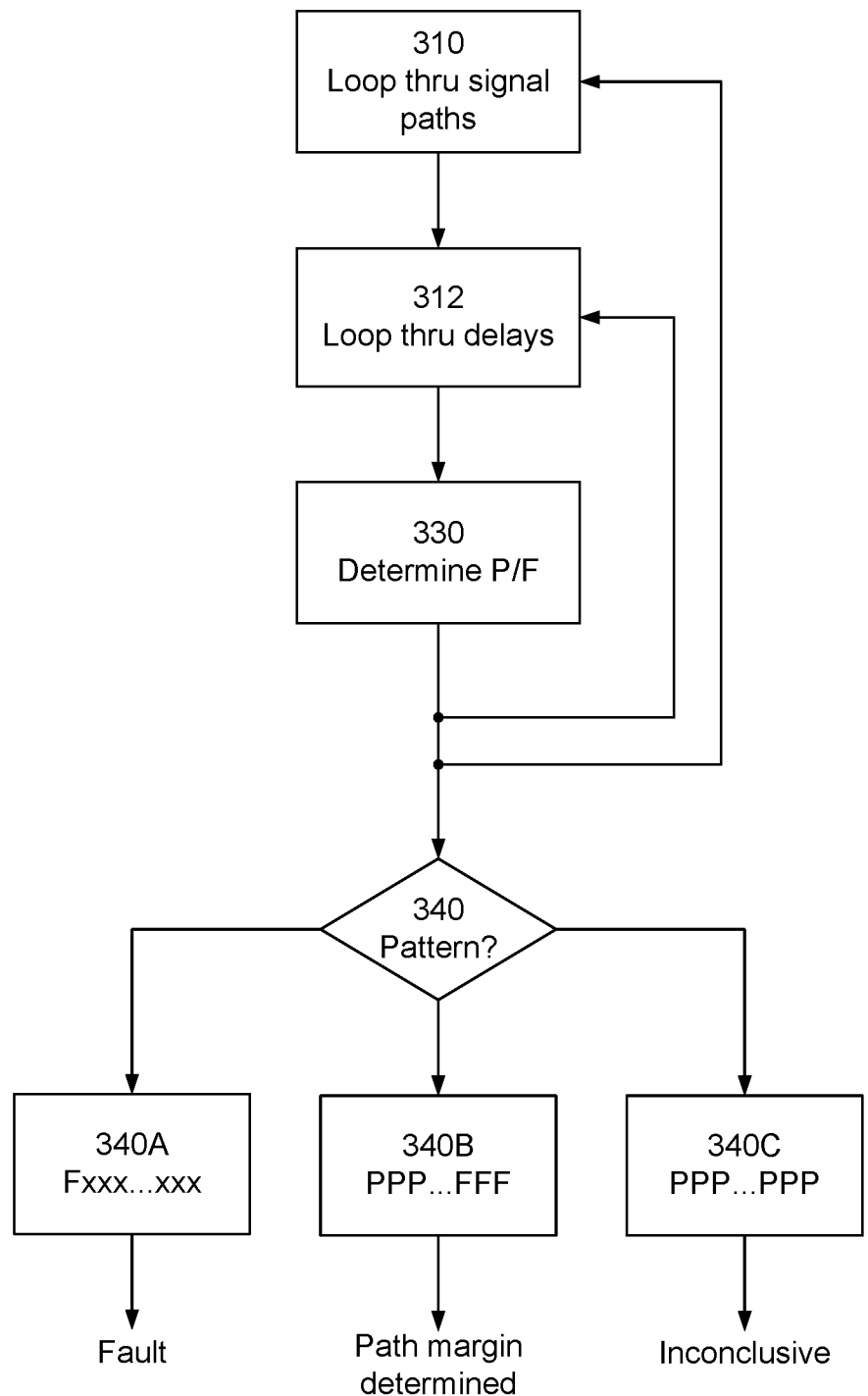
FIG. 3 is a flow diagram of a PMM system operating in detection mode, in accordance with some embodiments of the present disclosure.
Figure 4:
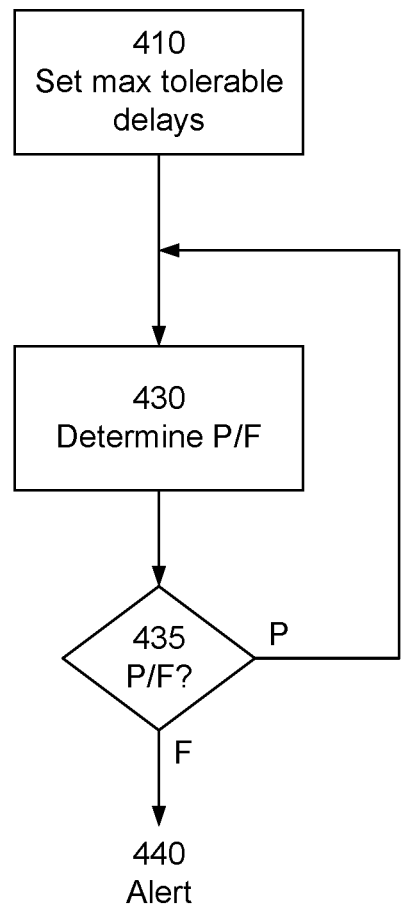
FIG. 4 is a flow diagram of a PMM system operating in monitor mode, in accordance with some embodiments of the present disclosure.
Figure 5:
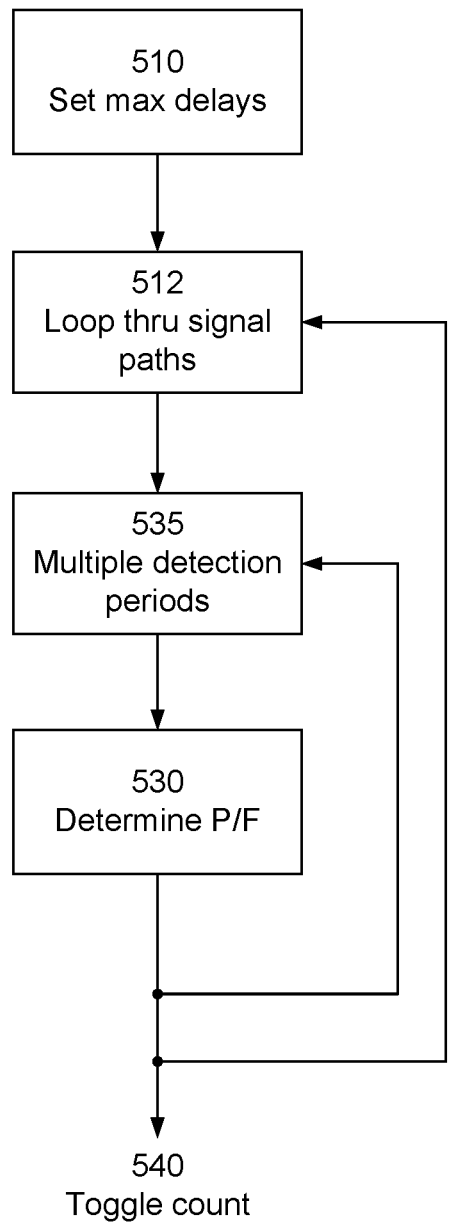
FIG. 5 is a flow diagram of a PMM system operating in toggle count mode, in accordance with some embodiments of the present disclosure.

FIGS. 3-5 illustrate operation of the PMM system in three different modes. FIG. 3 shows detection mode. In this mode, the PMM system performs a sequence of measurement steps to determine the slowest signal paths (i.e., the signal path with the lowest path margin) from among the signal paths monitored by each PMM circuit. This measurement may be repeated periodically. The collected PMM data may be analyzed to produce a model of the margin delay across the chip. FIG. 4 shows monitor mode. In this mode, the PMM system continuously monitors the slowest paths to detect and/or predict changes in the margin for these paths. If a signal path fails (i.e., no longer has sufficient path margin for proper operation) or is about to fail, the PMM system may collect and analyze the corresponding data and report the situation. FIG. 5 shows toggle count mode. In this mode, the PMM system detects transitions in the selected signal paths over a predefined time duration. Data collected over time can be used to estimate the activity levels of different parts of the chip. This can then be used for aging and power management use cases.

FIG. 3 is a flow diagram of a PMM system operating in detection mode, in accordance with some embodiments of the present disclosure. In this example, a PMM circuit has N delay buffers so that it may implement any of (N+1) possible delays 0Δ to NΔ where Δ is the delay introduced by one delay buffer. It is also assumed that different functional signals and signal paths may be coupled to the PMM circuit, for example through a multiplexer as described previously.

The basic measurement in FIG. 3 shown at 330 is the comparison of a functional signal with a delayed version of the signal, resulting in a P(ass) or F(ail), as described previously with respect to FIG. 2A and FIG. 2B. Each PMM circuit makes this measurement once for each clock cycle, which is for a specific functional signal and corresponding signal path and for a specific amount of delay. Over multiple clock cycles, the process of FIG. 3 repeats this measurement for different signal paths and for different amounts of delay. In the example of FIG. 3, the inner loop 312 cycles through different amounts of delay and the outer loop 310 cycles through different signal paths, although the order could also be reversed. In loop 312, the delay may start with 0Δ and increment up to the maximum of NΔ, as selected by the SEL signal in FIG. 2A.

At the end of this process, each signal path is characterized by a sequence of passes (P) and fails (F) for different amounts of delay. There are three basic patterns, as shown at 340A-C. In each of these patterns, the first pass/fail (P/F) is the value at a delay of 0Δ and the last P/F is the value at a delay of NΔ. In these patterns, x stands for don't care, meaning that the value could be either P or F. Note that multiple measurements could be made for each delay nΔ. In addition, P may be the result of a functional signal that is not changing value. Hence, the P's and F's shown in 340 may be accompanied by a confidence level of the value. If multiple measurements are taken over a period of time, the final value may be skewed towards F. If one F or a small number of F's occur, the final value may be evaluated as F, on the assumption that the larger number of P's may be a result of no transitions in the functional signal. The threshold number of F's may be programmable. In pattern 340A, the value at 0Δ is F. However, the value at 0Δ should always be P since the functional signal is being compared to itself. Therefore, this pattern 340A indicates a fault in the PMM system. In pattern 340B, the pattern starts with P and then transitions to F at some point. If the transition occurs between delays of nΔ and (n+1)Δ, then the path margin is between nΔ and (n+1)Δ, as shown in the example of FIG. 2B. In pattern 340C, the pattern is all Ps. It is possible that the path margin is greater than NΔ. It is also possible that the functional signal is not changing value. As a result, this pattern is inconclusive. The result may be ignored until pattern 340B occurs. Under normal operation, other patterns of P's and F's should not be normally occurring.

At the end of this process, the path margin for signal paths with pattern 340B will be determined. If there are multiple functional signals and signal paths monitored by a PMM circuit, then the slowest of the signal paths may also be identified. The slowest signal path is the one that changes from P to F the soonest in pattern 340B (i.e., fewest number of P's). In monitor mode, the PMM system may monitor only the slowest signal paths since they have less margin before failure.

FIG. 4 is a flow diagram of a PMM system operating in monitor mode, in accordance with some embodiments of the present disclosure. In monitor mode, the PMM system monitors signal paths to detect deterioration of the path margin. The current path margins may be determined in detection mode, as described in FIG. 3. In monitor mode, at 410, the PMM circuits are set to the maximum tolerable delays by the PMM controller. For example, if pattern 340B is P at a delay of nΔ and F at a delay of (n+1)Δ, then the PMM circuit is set for a delay of nΔ. At 430, the PMM circuits then monitor the signal paths by collecting P/F's at these delay settings. In this example, if the path margin deteriorates sufficiently, then the P at a delay of nΔ will change to an F. At 435, if an F is detected, the PMM system may take appropriate actions 440, such as providing an alert. If no F is detected, then the PMM system continues to monitor the signal paths.

According to one embodiment, the PMM system interleaves detection mode and monitor mode. The PMM system may periodically enter detection mode to recalibrate which signal paths are the slowest and the current path margins on those signal paths. In monitor mode, when a signal path changes from P to F, the PMM system may enter detection mode for that signal path to confirm the deteriorated path margin.

FIG. 5 is a flow diagram of a PMM system operating in toggle count mode, in accordance with some embodiments of the present disclosure. In toggle count mode, the PMM system measures the amount of toggling of the functional signal. This is a measure of activity level of the signal. At 510, the PMM circuits are set to the maximum delays: NΔ in this example. This setting maximizes the chances that a toggle in the value of the functional signal will generate an F. At 530, the PMM circuits allow the functional signal to run for a predetermined number of cycles and determine whether any F has been produced during this detection period. At 535, this is repeated for multiple detection periods. The result at 540 is a "toggle count", such as x % of the detection periods resulted in F, or x out of y detections periods resulted in F. This is a measure of the activity level on the signal path. If multiple monitored signal paths are coupled to the same PMM circuit, then at 512 the process of FIG. 5 may also cycle through the different signal paths.

FIGS. 2-5 describe individual PMM circuits. However, as shown in FIG. 1, an integrated circuit may contain many instances of PMM circuits, which for convenience will be referred to as PMM instances. The number of PMM instances can reach thousands in an integrated circuit. In FIG. 1, the controller 150 manages operation of the PMM instances on the chip. In one approach, the controller is implemented as multiple local controllers rather than a single controller for the entire chip. There may be different local controllers for different sections of the chip, for example different voltage or power domains, different clock domains, different functional blocks, etc. Each controller can support multiple groups of PMM instances within the same power domain. Each group may have a different clock domain.

Controllers may communicate with the PMM instances using different mechanisms. In one approach, PMM instances are connected in a loop, analogous to a daisy chain, and the controller has a single connection to the loop. The controller may connect to multiple loops. The controller may also communicate to the PMM instances in a broadcast mode.

The controller performs several functions. One function is to control and configure the PMM instances. The controller may decide which mode (detection, monitor or toggle count) is appropriate for each PMM instance and send instructions to configure the PMM instances accordingly. It may also send parameters to the PMM instances, such as the current path margin or which signal paths should be monitored in monitor mode. The controller includes local memory to store these parameters and instructions, so that it knows what each PMM instance is doing.

The controller also receives the PMM signals from the PMM instances. It may store the raw data received and/or it may analyze this data and store the results.

The controller may also communicate with other resources, both on-chip and off-chip. For example, collected data may be transferred off-chip for longer term storage and/or more complex analysis. The controller may also receive instructions or additional information from other sources, and then direct the PMM instances accordingly.

In FIG. 1, the integrated circuit contains many PMM instances, so small area and ease of integration are important. In one aspect, automated software (EDA software) is used to automatically insert PMM instances into the design of an integrated circuit. The number and distribution of PMM instances depends on the application. In some cases, approximately 0.5% of the silicon are of the relevant integrated circuit blocks may be used for PMM instances. Automated EDA software may recommend signal paths to monitor, for example based on criteria such as timing analysis, type of gates in the path and/or the metal layer of the interconnect.

In one approach, the PMM instances are inserted in connection with scan chain insertion and automatic test pattern generation for the integrated circuit. Scan chains are used primarily for testing the functionality of a chip. Without scan chains, only the external inputs and outputs to the chip are accessible. Signals and circuits in the interior of the integrated circuit are not easily accessible. A scan chain is a circuit structure that provides access to the interior of an integrated circuit. The scan chain has access to internal circuits. This allows the values of internal circuits to be set via the scan chain and allows the values of internal circuits to be read out via the scan chain. In this way, a test stimulus may be applied at some interior point within the chip, and the corresponding response at another interior point may be read out. This simplifies testing because more signal values and signal paths are accessible.

Figure 6:
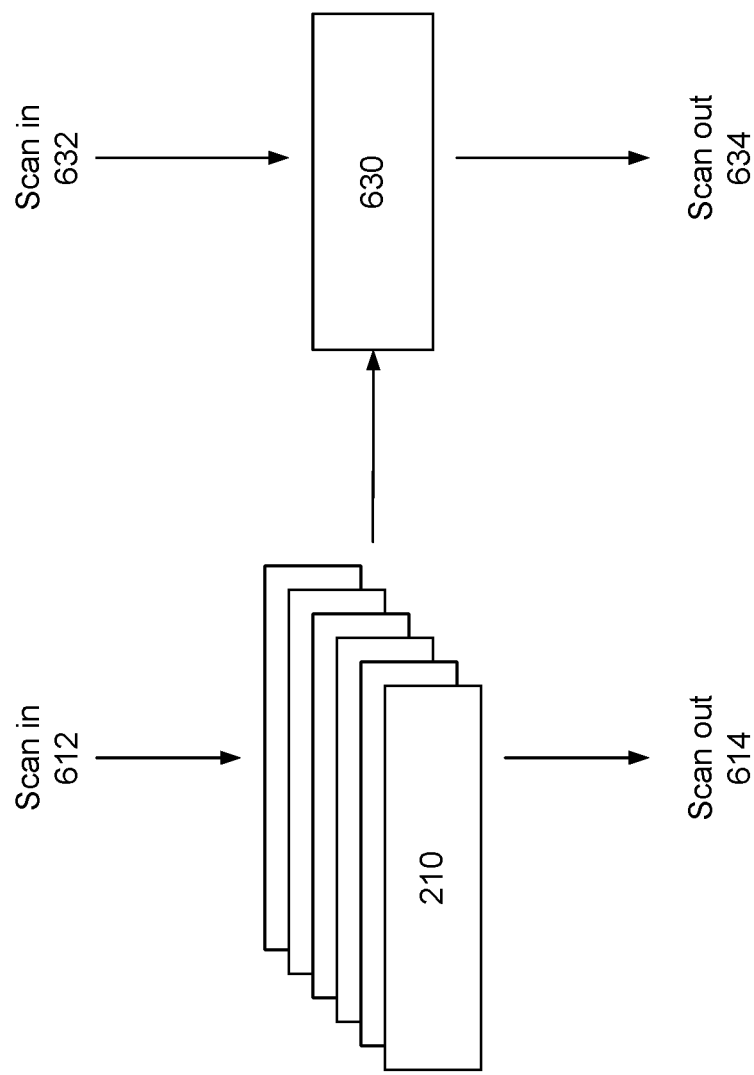
FIG. 6 is a block diagram of a PMM system using scan chains, in accordance with some embodiments of the present disclosure.

Scan chains may also be used with the PMM system, as shown in FIG. 6. FIG. 6 shows the different signal paths 210, which are monitored by the PMM system 630. The sequential circuits in signal paths 210 are also connected into scan chains. The input 612 to these scan chains can be used to set the values of the sequential circuits, and the output 614 from these scan chains can be used to read the values of the sequential circuits. Similarly, the sequential circuits in the PMM system 630 are also connected into scan chains. This includes the flops 231 and 236 shown in FIG. 2A, but it may also include registers that hold configuration information, such as the SEL values for the multiplexers 234 and 250 in FIGS. 2A and 2C. The input 632 and output 634 to the PMM scan chain(s) can be used to set and read values from the PMM system.

Referring to FIG. 2A, instead of relying on whatever values of the functional signal 215 occur while the chip is operating in mission mode, the chip may be operated in a testing mode. The scan chain input 612 may be used to set the values of the functional signal 215. For example, the functional signal 215 may be toggled, thus avoiding false P's resulting from a functional signal that is not changing value. The scan chain output 634 may be used to read out the PMM signal 240.

The scan chains 612, 614 to the operating circuits typically are not used when the chip is operating in mission mode. However, the PMM scan chains 632, 634 may be used in mission mode. For example, the scan chain input 632 may be used as a way for the PMM controller to configure the different PMM circuits, and the scan chain output 634 may be used to read out the PMM signals. The PMM controller may provide interfaces to the PMM scan chains.

Scan chain insertion is an automated process. If scan chains are used as described above, then the creation of PMM scan chains may occur as part of this process. For example, some scan chains may be used for the PMM system, rather than used to test the functionality of the integrated circuit. In some cases, the data to the scan chains 612, 614 for the operating circuits may be provide in a compressed form to reduce the I/O bandwidth required. It is decompressed on-chip, distributed to the scan chains, and the results are collected and compressed for transmission off-chip. The PMM scan chains may skip this compression/decompression, particularly if the compression of results is lossy.

Automatic test pattern generation (ATPG) is the automated generation of test stimulus used to test a chip. These test stimulus are typically applied to the chip via the scan chains, with the corresponding results read out by scan chains. If scan chains are also used to set the functional signals 215, then the ATPG capability may be extended to generate the signal values used by the PMM system. Patterns may be generated to exercise specific signal paths. This will be coordinated with the selection of signal paths and the selection of amount of delay applied. The resulting test stimuli may be managed and applied by the PMM controller.

Figure 7:
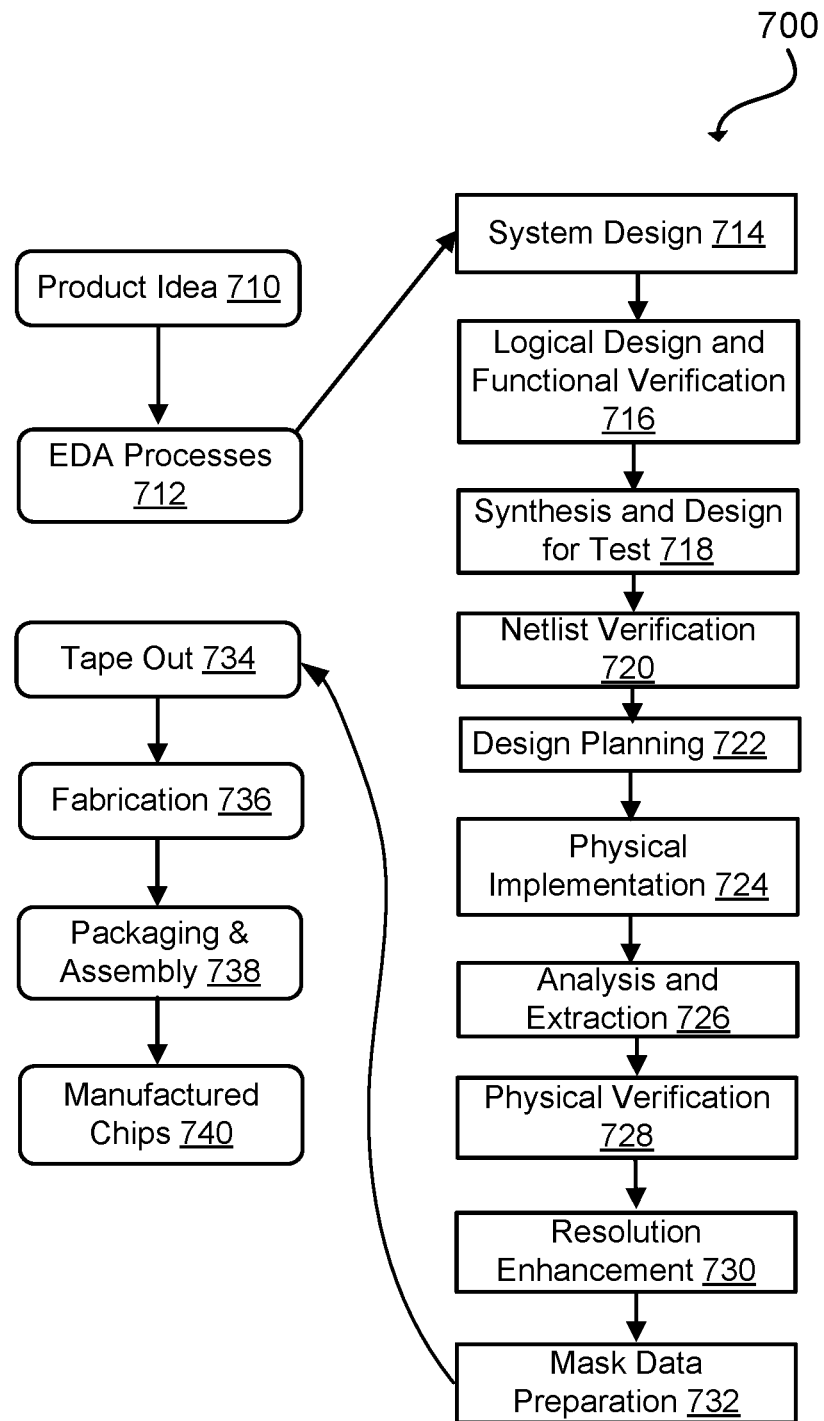
FIG. 7 is a flow diagram of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 737 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
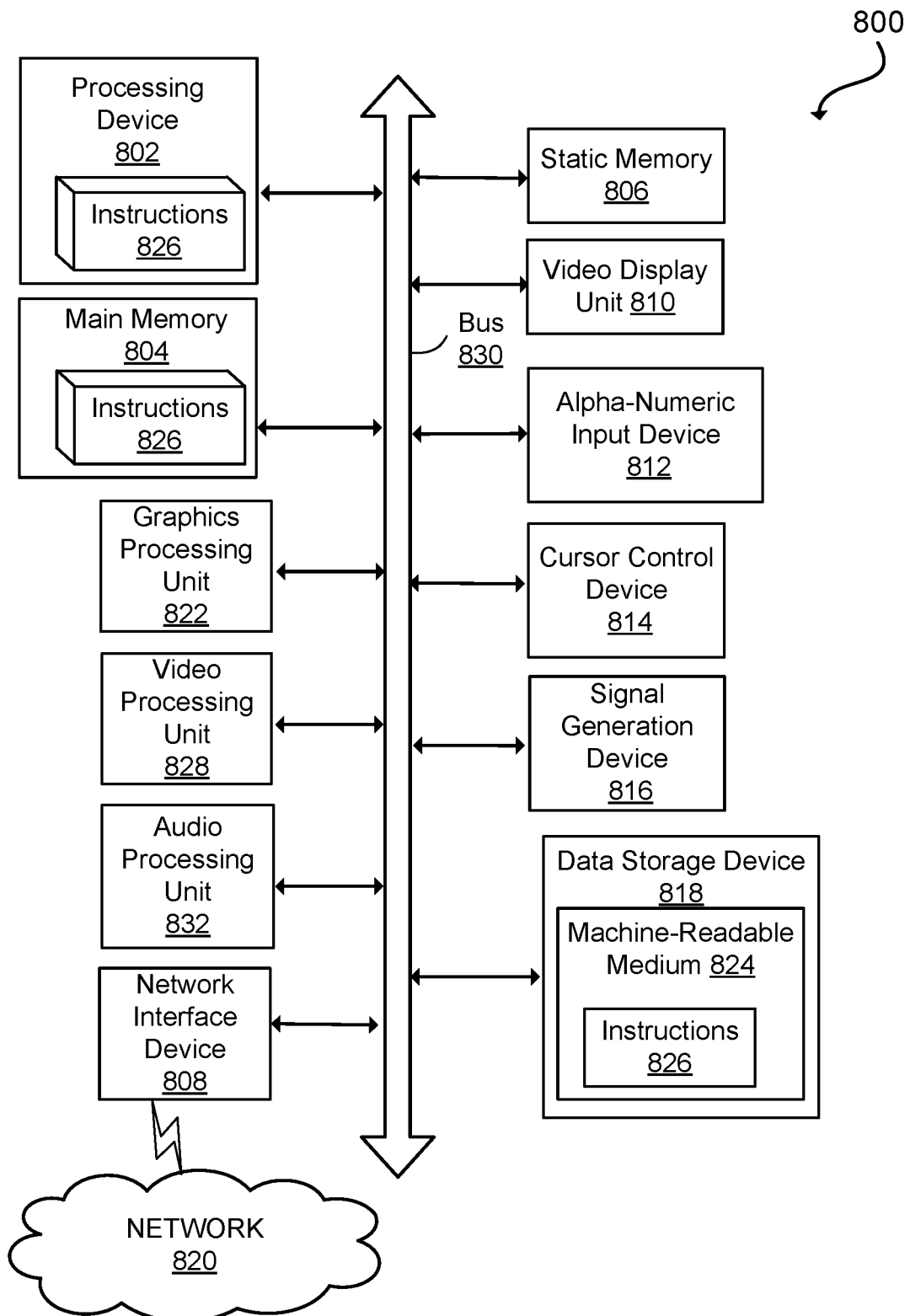
FIG. 8 is a block diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A system, comprising:
   a plurality of path margin monitor (PMM) circuits that receive (a) functional signals propagating along signal paths in an integrated circuit, and (b) corresponding clock signals used to clock the functional signals; and output PMM signals indicative of path margins for the signal paths, the PMM signals generated from the received functional signals and clock signals; and
   a controller that controls the PMM circuits, and receives and analyzes the PMM signals to monitor the path margins across the integrated circuit;
   wherein the PMM circuits and the controller are integrated as part of the integrated circuit.

2. The system of claim 1, wherein the PMM circuits comprise:
   a plurality of delay buffers that produce delayed versions of the received functional signal with different amounts of delay; and
   a comparator that compares at least one of the delayed versions of the functional signal with the received (undelayed) functional signal.

3. The system of claim 2, wherein, at each clock cycle, the comparator compares not more than one delayed version of the functional signal with the undelayed functional signal.

4. The system of claim 2, wherein the PMM circuits further comprise:
   a multiplexer that multiplexes outputs of the delay buffers to the comparator, wherein the controller selects which delay buffer output is coupled to the comparator.

5. The system of claim 1, further comprising, for at least one of the PMM circuits:
   a multiplexer that multiplexes multiple signal paths to the PMM circuit, wherein the controller selects which of the multiple signal paths is coupled to the PMM circuit.

6. A method, comprising:
   sending control signals to a plurality of path margin monitor (PMM) circuits to control operation of the PMM circuits, the PMM circuits integrated as part of an integrated circuit and connected to signal paths in the integrated circuit;

receiving PMM signals from the PMM circuits, the PMM signals indicative of path margins for the monitored signal paths; and analyzing the PMM signals to monitor path margins across the integrated circuit;

wherein the method is performed by a controller integrated as part of the integrated circuit.

7. The method of claim 6, wherein the PMM circuits compare functional signals received from the signal paths with delayed versions of the functional signals, the PMM signals are indicative of the comparisons, and the control signals determine an amount of delay for the delayed versions.

8. The method of claim 7, wherein sending control signals comprises sending a series of control signals that apply different amounts of delay to functional signals from a plurality of signal paths; and analyzing the PMM signals comprises determining from the PMM signals which of the signal paths has a lowest path margin and an amount of the lowest path margin.

9. The method of claim 7, wherein sending control signals comprises sending control signals that apply an amount of delay corresponding to lowest path margins for signal paths monitored by the PMM circuits; and analyzing the PMM signals comprises determining from the PMM signals whether the path margins for said signal paths have decreased below the lowest path margins.

10. The method of claim 7, wherein the PMM signals are indicative of toggling of the functional signals, and analyzing the PMM signals comprises estimating an activity level for the signal paths based on an amount of toggling.

11. The method of claim 6, wherein the controller has different modes of operation, and the control signals configure the PMM circuits according to the controller's mode of operation.

12. The method of claim 6, wherein analyzing the PMM signals provides real-time monitoring of path margins across the integrated circuit.

13. The method of claim 6, wherein analyzing the PMM signals identifies changes in path margins over time.

14. The method of claim 6, wherein analyzing the PMM signals comprises building a model for path margin across the integrated circuit.

15. The method of claim 6, wherein the integrated circuit is a test chip, or the method is performed during testing or calibration of the integrated circuit.

16. The method of claim 6, wherein the integrated circuit is a production chip, and the method is performed during normal operation of the production chip.

17. A non-transitory computer readable medium comprising stored instructions, which when executed by a processor, cause the processor to:

insert a plurality of path margin monitor (PMM) circuits into a design of an integrated circuit, wherein the PMM circuits receive (a) functional signals propagating along signal paths in the integrated circuit, and (b) corresponding clock signals used to clock the functional signals; and output PMM signals indicative of path margins for the signal paths, the PMM signals generated from the received functional signals and clock signals; and configure and insert a controller that controls the PMM circuits into the design of the integrated circuit, wherein the controller receives and analyzes the PMM signals to monitor the path margins across the integrated circuit.

18. The non-transitory computer readable medium of claim 17, wherein the PMM circuits are inserted in connection with insertion of scan chains into the design of the integrated circuit.

19. The non-transitory computer readable medium of claim 17, wherein the controller is configured in connection with automatic test pattern generation for the integrated circuit.

20. The non-transitory computer readable medium of claim 17, wherein inserting the plurality of PMM circuits comprises inserting at least 1000 instances of PMM circuits.

* * * * *